(12) United States Patent
Younis et al.

(10) Patent No.: US 6,621,307 B1
(45) Date of Patent: Sep. 16, 2003

(54) METHOD AND CIRCUIT FOR DETERMINING FREQUENCY AND TIME VARIATIONS BETWEEN ELECTRONIC SIGNALS

(75) Inventors: Ahmed Younis, Austin, TX (US); Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/224,978

(22) Filed: Aug. 20, 2002

(51) Int. Cl.[7] ............................................. H03D 13/00
(52) U.S. Cl. ................................. 327/12; 327/3; 327/43
(58) Field of Search ............................. 327/7, 2, 3, 12, 327/43, 39, 40, 84; 375/371

(56) References Cited

U.S. PATENT DOCUMENTS 6,034,554 A * 3/2000 Francis et al. ................. 327/12

6,301,318 B1 * 10/2001 Wei et al. ..................... 375/371

* cited by examiner

Primary Examiner—Dinh T. Le
(74) Attorney, Agent, or Firm—Pablo Meles; H. C. Chan

(57) ABSTRACT

A method and circuit for determining variation between an input clock signal (CLK0) and a reference clock signal (REFCLK) is provided. A plurality of time shifted input clock signals (CLK0, CLK1, ..., CLK09) can be generated from a single input clock signal (CLK0). The plurality of time shifted input clock signals (CLK0, CLK1, ..., CLK09) can be sampled at successive periodic intervals occurring relative to the reference clock signal (REFCLK). For each of the time shifted input clock signals (CLK0, CLK1, ..., CLK09), a sampled value for a succeeding and a preceding periodic interval can be compared to determine whether there is a variation between an input clock signal (CLK0) and a reference clock signal (REFCLK).

26 Claims, 10 Drawing Sheets

METHOD AND CIRCUIT FOR DETERMINING FREQUENCY AND TIME VARIATIONS BETWEEN ELECTRONIC SIGNALS

FIELD OF THE INVENTION

This invention relates generally to signal processing, and more particularly to a method and system for determining frequency and time variations between electronic signals.

BACKGROUND OF THE INVENTION

In signal processing applications, it is often necessary to determine certain parameters of a signal in order to accurately track the signal. These applications can include, but are not limited to, frequency control, symbol synchronization, bit synchronization and coherent carrier tracking. Phase-locked loops (PLLs) are well known in the art and they can function as a signal tracking tool. A PLL is an electronic circuit that can be configured to control an oscillator so that the oscillator produces a signal having a constant phase angle relative to a reference signal. A PLL can be configured to control a voltage controlled oscillator (VCO). In this regard, a variable tuning voltage can be applied to an input of the VCO to produce an output that varies over a wide frequency range. Notably, by applying a specified tuning voltage, the VCO can produce one or more signals having a particular frequency.

The resolution of a circuit can be used to define the variation between an input signal and a reference signal. In general, the smaller the variation between the input signal and the reference signal, the greater the accuracy or resolution. In contrast, the greater the variation between the input signal and a reference, the lesser the accuracy or resolution. Notably, less resolution will require less timing samples or counts to achieve synchronization. For example, a system that requires a 5% resolution or accuracy may require 128 counts to achieve such precision. However, a system that requires 0.03% accuracy may require 16,384 counts. In this context, a 5% accuracy provides less precision than a 0.03% accuracy or resolution. Importantly, the greater the required resolution, the greater the number of required counts and the greater the processing time. This greater processing time can adversely affect system speed and performance.

In certain applications, it can be critical to maintain a minimal resolution in order to maintain functionality of a circuit or particular integrated circuit (IC). For example, it can be necessary to switch a PLL from a first reference clock signal to a second reference clock signal. Under normal operation, the PLL will attempt to converge to the frequency of the first reference signal and once the desired accuracy is met, switching to the second reference signal can occur. However, if the frequency of the PLL and the second reference clock signal are not within a certain minimal resolution at the switchover point, signal divergence can result in a loss of synchronization, which can ultimately cause a loss of system functionality. To prevent divergence, greater resolution can be required.

Given these inflexibilities and other inherent drawbacks, there is a need for providing a method and circuit for determining variations between electronic signals in order to overcome the limitations described.

SUMMARY OF THE INVENTION

The invention provides a method for determining variation between a frequency of an input clock signal and a frequency of a reference clock signal. The method can include the step of generating a plurality of time shifted input clock signals that are time shifted relative to the input clock signal. The plurality of time shifted signals can be sampled at periodic intervals relative to the reference clock signal. Sampled values for the time shifted signals can be compared with values for the reference clock to determine the variation between the frequency of the input clock signal and a frequency of the reference clock signal. The variation can include a condition wherein the frequency of the input clock signal can be less than the frequency of the reference clock signal, or the frequency of the input clock signal can be greater than the frequency of the reference clock signal, and the frequency of the input clock signal can be equal to the frequency of the reference clock signal.

The generating step can further include the step of shifting each of the plurality of time shifted signals by an amount equivalent to the period of the input clock signal divided by the number of input clock signals. The number of input clock signals includes the input clock signal and the time shifted versions of the input clock signal. The time shifted versions of the input clock signal can all have the same frequency.

The sampling step can further include the step of sampling at least one of the plurality of time shifted signals on a first rising edge of the reference clock signal to yield a first sampled value for at least one of the plurality of time shifted signals. A value for one or more of the time shifted signals can subsequently be stored in a flip-flop or register. The value for the one or more of the plurality of time shifted signals can be stored on a first falling edge of the reference clock signal, which occurs subsequent to the first rising edge of the reference clock signal. Furthermore, one or more of the plurality of time shifted signals can be sampled on a second rising edge of the reference clock signal, which occurs subsequent to the first rising edge of the reference clock signal to yield a second sampled value for one or more of the plurality of time shifted signals. Finally, the first and second sampled value for one or more of the plurality of time shifted signals can be compared to determine how the frequency of the input clock signal is varied from the frequency of the reference clock signal.

In another aspect of the invention, an electronic circuit can be provided for determining variation between a frequency of an input clock signal and a frequency of a reference clock signal. The electronic circuit can include means for generating a plurality of time shifted input clock signals. The time shifted signals can be configured so that they can be shifted relative to the input clock signal. Means can be provided for sampling the plurality of time shifted signals at periodic intervals relative to the reference clock signal. Comparing means can be configured for comparing values for the sampled time shifted signals with values for the reference clock signal to determine the variation between the frequency of the input clock signal and a frequency of the reference clock signal. The variation can include a condition where the frequency of the input clock signal can be less than the frequency of the reference clock signal, the frequency of the input clock signal can be greater than the frequency of the reference clock signal, or the frequency of the input clock signal can be equal to the frequency of the reference clock signal.

The generating means of the electronic circuit can further include means for shifting each of the plurality of time shifted signals by an amount equivalent to the period of the input clock signal divided by the number of input clock signals. The number of input clock signals can include the input clock signal and the shifted versions of the input clock signals. The time shifted signals can be configured so that they can all have the same frequency.

The sampling means can further include means for sampling at least one of the plurality of time shifted signals on a first rising edge of the reference clock signal to yield a first sampled value for one or more of the plurality of time shifted signals. A flip-flop or register can be configured to store a value for one or more of the plurality of time shifted signals. The storing means can store the first sampled value of one or more of the plurality of time shifted signals on a first falling edge of the reference clock signal, which occurs subsequent to the first rising edge of the reference clock signal. One or more of the plurality of time shifted signals can be sampled on a second rising edge of the reference clock signal occurring subsequent to the first rising edge of the reference clock signal, to yield a second sampled value for one or more of the plurality of time shifted signals. The comparing means can be configured to compare the first and the second sampled values for one or more of the plurality of time shifted signals, in order to determine the variation in frequency between the input clock signal and the reference clock signal.

In another aspect of the invention, a high resolution frequency detection circuit can be provided for determining variance between an input clock signal and a reference signal. The high resolution frequency detection circuit can include a first bank of flip-flops, a second bank of flip-flops, a third bank of flip-flops, and a fourth bank of flip-flops. Clock inputs of flip-flops in the first bank of flip-flops can be coupled to the reference clock signal and each data input of the flip-flops in the first bank of flip-flops can be singularly coupled to one of a plurality of time shifted input clock signals. Each data input of the flip-flops in the second bank of flip-flops can be singularly coupled to an output of each of the flip-flops in the first bank of flip-flops. Clock inputs of the flip-flops in the second bank of flip-flops can be coupled to a complement of the reference clock signal.

A first input of each XOR gate in a first bank of XOR gates can be singularly coupled to an output of one of the flip-flops in the first bank of flip-flops, while a second input of each of the XOR gates can be singularly coupled to an output of one of the flip-flops in the second bank of flip-flops. The XOR gates can be configured to compare a previously sampled value for an input clock signal with a successively sampled value for the input clock signal. A clock input of each of the flip-flops in the second bank of flip-flops can be coupled to a signal that is the complement of the reference clock signal. The high resolution frequency detection circuit can further include a $\log_2(n)$ bit adder wherein each input of the $\log_2 M(n+1)$ bit adder can be singularly coupled to an output of one of the XOR gates in the first bank of XOR gates.

Another aspect of the invention can include a high resolution frequency detection circuit for determining variance between an input clock signal and a reference signal. In this regard, a clock input of each flip-flop in a first bank of flip-flops can be coupled to the reference clock signal and each flip-flop input can be singularly coupled to one of a plurality of time shifted input clock signals. Each input of flip-flops in a second bank of flip-flops can be singularly coupled to an output of each of the flip-flops in the first bank of flip-flops. A clock input of each flip-flop in the second bank of flip-flops can be coupled to a complement of the reference clock signal. Clock inputs of each of flip-flops in a third bank of flip-flops can be coupled to a signal that is the complement of the reference clock signal. Each input of the flip-flops in the third bank of flip-flops can be singularly coupled to one of a plurality of time shifted input clock signals. Each input for flip-flops in fourth bank of flip-flops can be singularly coupled to an output of each of the flip-flops in the third bank of flip-flops. Clock inputs of each of the flip-flops in the fourth bank of flip-flops can be coupled to the reference clock signal A first input of each of XOR gate in a first bank of XOR gates can be singularly coupled to an output of one of the flip-flops of the first bank of flip-flops, while a second input of each of the XOR gates can be singularly coupled to an output of one of the flip-flops in the fourth bank of flip-flops. The XOR gates can be configured to compare a previously sampled value for an input clock signal with a successively sampled value for the input clock signal. A first input of each of the XOR gate in a second bank of XOR gates can be singularly coupled to an output of one of the flip-flops of the second bank of flip-flops, while a second input of each of the XOR gates can be singularly coupled to an output of one of the flip-flops of the third bank of flip-flops. Each of the XOR gates can be configured to compare a previously sampled value for an input clock signal with a successively sampled value for the input clock signal.

The high resolution frequency detection circuit can be configured so that a clock input of each of the flip-flops in the second bank of flip-flops can be coupled to a signal that is the complement of the reference clock signal. A clock input of each of the flip-flops in the fourth bank of flip-flops can be coupled to the reference clock signal. A first $\log_2(n+1)$ bit adder can be configured so that each input of the first n-bit adder can be singularly coupled to an output of one of the XOR gates of The first bank of XOR gates. The high resolution frequency detection circuit can further include a second $\log_2(n+1)$ bit adder configured so that each input of the first n-bit adder can be singularly coupled to an output of one of the XOR gates of the second bank of XOR gates.

In yet a further aspect of the invention, an enhanced resolution frequency detection circuit can be provided for determining the variance between an input clock signal and a reference signal. In this regard, the enhanced resolution frequency detection circuit can include a delay-locked loop having an input reference clock signal coupled thereto. A plurality of frequency detection circuits can be configured so that each clock input of the frequency detection circuits can be coupled to a separate output of the delay-locked loop. Each input of the frequency detection circuit can be coupled to a set of time shifted input clock signal. A plurality of XOR gates can be configured so that each of the plurality of XOR gates can be coupled to an output of each of the plurality of frequency detection circuits so as to provide an XOR operation of all bits in a same bit position at the output of each of the frequency detection circuit.

The invention also provides a time detection circuit for determining the variation between an input clock signal and a reference signal. The time detection circuit can include a first bank of n+1 flip-flops and a plurality of time shifted input clocksignals. Each of the time shifted input clock signals can be singularly coupled to a clock input of a flip-flop in the first bank of n+1 flip-flops. The reference clock signal can be coupled to an input of each of the n flip-flops in the first bank of flip-flops.

DETAILED DESCRIPTION OF THE DRAWINGS

Figure 1:
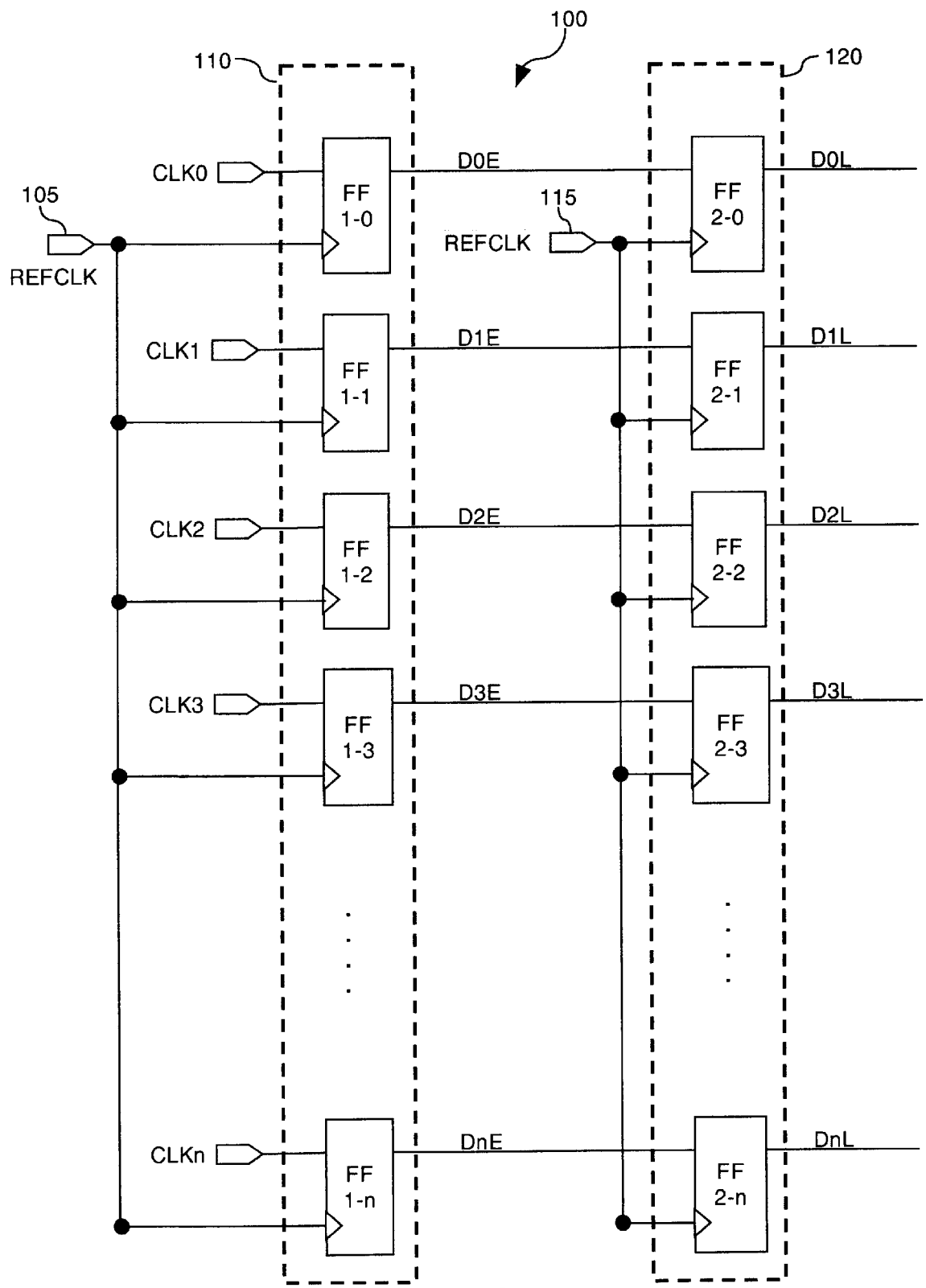
FIG. 1 is an exemplary frequency detection circuit in accordance with the invention.

Referring to FIG. 1, there is shown an exemplary circuit frequency detection circuit 100 in accordance with the invention. Regarding circuit 100, there is shown a first bank of a flip-flops (FFs) 110 and a second bank of flip-flops 120. Each bank of FFs 110 and 120 can contain "n+1" FFs. A reference clock signal (REFCLK) 105 can be coupled to a clock input of each of the "n+1" flip-flops located in the first bank of flip-flops 110. Notably, REFCLK signal 105 can be coupled to flip-flops 1-0, 1-1, 1-2, 1-3 . . . 1-n. The complement or inverse of REFCLK signal 105, namely input signal 115, can be coupled to a clock input of each of the "n+1" flip-flops located in the second bank of flip-flops 120. Notably, input signal 115 can be coupled to flip-flops 2-0, 2-1, 2-2, 2-3, . . . , 2-n. The flip-flops can preferably be D-type flip-flops although the invention is not limited in this regard.

Advantageously, a plurality of input clock signals can be used to achieve greater accuracy in determining the variation between an input clock signal and a reference clock signal. Each of the plurality of the input clock signals can have the same frequency and can be a time shifted version of the input clock signal. Each input clock signal that is to be compared with the reference clock signal 105 can be singularly coupled to a flip-flop as shown. For example, input or VCO clock signal CLK0 can be coupled to the data input of the first flip-flop in the first bank of flip-flops 110, namely flip-flop 1-0. Similarly, clock signal CLK1 can be coupled to the data input of the second flip-flop in the first bank of flip-flops 110, namely flip-flop 1-1. Finally, clock signal CLKn can be coupled to the data input of the last flip-flop in the first bank of flip-flops 110, namely FF 1-n. It should readily be understood that "n" is a placeholder which can represent a positive whole number.

The output of each flip-flop in the first bank of flip-flops 110 can be coupled to the data input of a corresponding flip-flop in the second bank of flip-flops 120 as shown. For example, the output of flip-flop 1-0 can be coupled to the data input of flip-flop 2-0 and the output of flip-flop 1-1 can be coupled to an input of flip-flop 2-1.

A plurality of input clock signals can be used to determine the variation between the frequency of the input clock signal and the reference clock signal. These input clock signals can be VCO clock signals. For illustrative purposes a set of 20 clock signals can be used to determine the variation in frequency between an input clock signal and a reference clock signal. Notably, the invention is not limited in this regard and the set of clock signals can include other quantities of clock signals without departing from the spirit and scope of the invention. Each of the clock signals in the set of 20 clock signals can have the same frequency but is a shifted version of the input clock signal. In this regard, each successive signal in the set of 20 clock signals can be shifted by $$\frac{T}{(20)},$$

where T is the period of the input clock signal, and $$T = \frac{1}{f},$$

where f is the frequency of input clock signal CLK0 can be configured as the input clock signal and each successive clock signal CLK1, CLK2, CLK3, . . . , CLK19 can successively vary by $$\frac{T}{20}.$$

In operation, on the rising edge of REFCLK, the first bank of flip-flops 110 of the circuit 100 can be used to sample the value of each of the clock signals comprising the set of 20 clock signals, namely CLK0, CLK1, CLK2, CLK3, . . . , CLK19. In this regard, n=19 in FIG. 1. The sampled values can be stored in the flip-flops 1-0, 1-1, 1-2, 1-3, . . . , 1-19, respectively. On the falling edge of the REFCLK signal 105, the stored values can be shifted into the corresponding flip-flops in the second bank of flip-flops 120. On the next rising edge of REFCLK signal 105, a new value can be sampled for the set of 20 clock signals CLK0, CLK1, CLK2, CLK3, . . . , CLK19 and the sampled values accordingly stored in the flip-flops 1-0, 1-1, 1-2, 1-3, . . . , 1-19, respectively. At this instant, a currently sampled value stored in each of the flip-flops of the first bank of flip-flops 110 can be compared with a previously sampled value stored in corresponding ones of each of the flip-flops comprising the second bank of flip-flops 120.

If the frequency of the CLK0 signal is the same as the frequency of the REFCLK signal 105, then the output from the first bank of flip-flops 110 can be the same as the output from the second bank of flip-flop 120. Notably, D0L=D0E, D1L=D1E, D2L=D2E, D3L=D4E, . . . , D19L=D19E. Importantly, if there is a difference or variation in the frequency between the input clock signal and the reference clock signal, then there will be a variation between at least some of the values stored in each of the flip-flops in the first bank of flip-flops 110 and corresponding flip-flops in the second bank of flip-flops 120. In that case, the DxL value can differ from the DxE value, where x is the bit number or the clock signal, and x=0, 1, 2, 3, . . . , 19.

Figure 2:
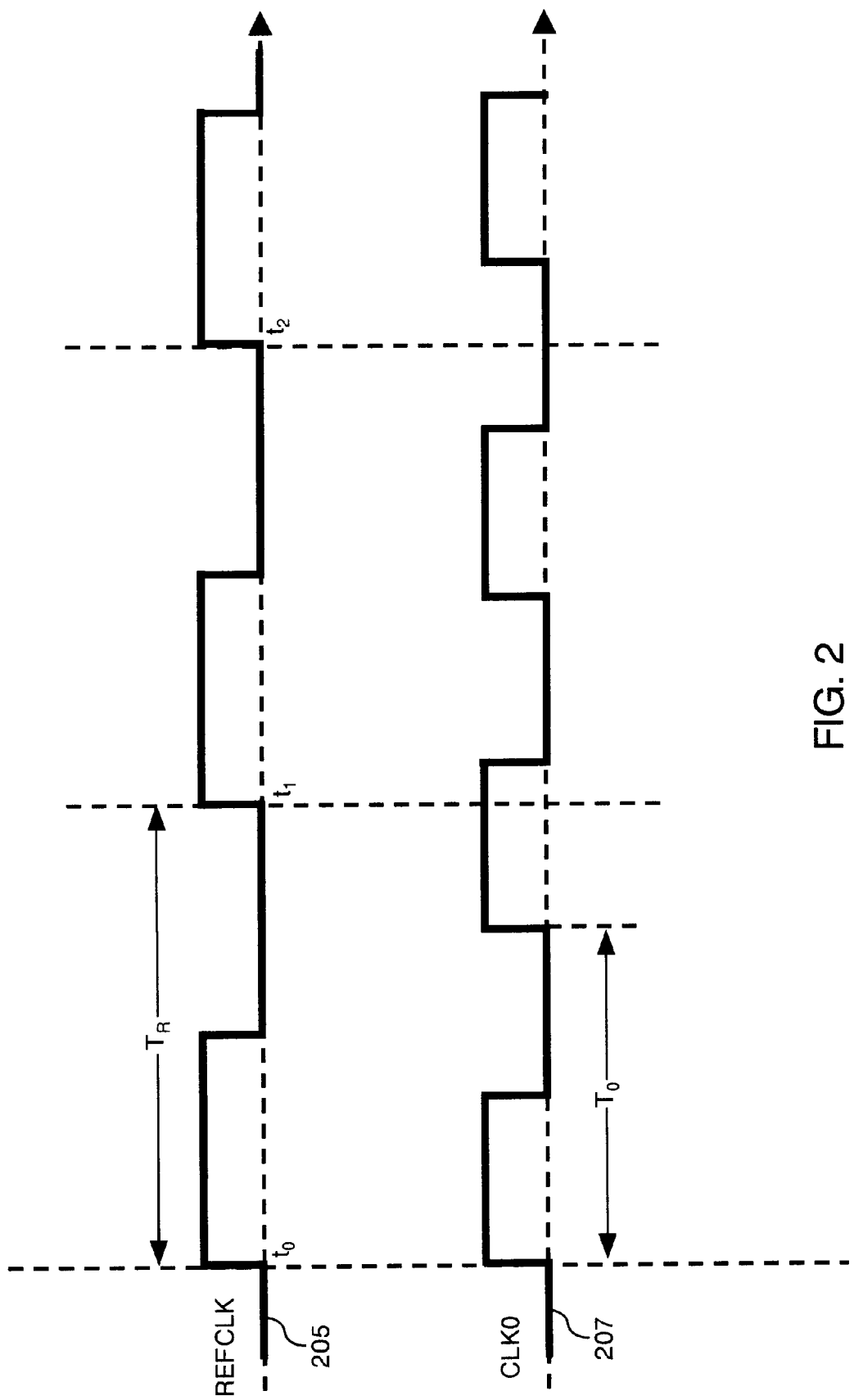
FIG. 2 is an exemplary timing diagram of a reference clock signal and an input clock signal in accordance with the inventive arrangements of FIG. 1.

The variation in the frequency can be expressed as follows. For exemplary purposes, the clock signal CLK0 can have a frequency denoted by $f_0$ and REFCLK can have a frequency denoted by $f_{ref}$. Consequently, the clock signal CLK0 can have a period denoted by $T_0$ and REFCLK can have a period denoted by $T_R$. FIG. 2 depicts an exemplary timing diagram of REFCLK and CLK0 signals. Although FIG. 2 depicts the REFCLK and CLK0 signals starting at the same instant in time, the invention is not limited in this regard. At the rising edge of REFCLK signal 205 which occurs at time $t_0$, the CLK0 signal 207 can be sampled. A second sample of the CLK0 207 can occur at a time $t_1$. However, $t_1=t_0+T_R$. A third sample of the CLK0 signal 207 can be taken on rising edge of REFCLK signal 205 occurring at a time $t_2$. However, $t_2=t_0+2T_R=(t_0+T_R)+T_R$ and $(t_0+T_R)=t_1$. Therefore, $t_2=t_1+T_R$. If $T<T_R$, then at $t_1$, CLK0 leads REFCLK by $(T_R T-)$. Similarly, if $T_0>T_R$, then at $t_1$, CLK0 lags REFCLK by $(T-T_R)$. The REFCLK signal can be represented mathematically by:

$$REFCLK = F_{ref}(t) = \sum_{m=-\infty}^{m=+\infty} [u(t - mT_R) - u(t - (m+1)T_R)],$$

where $u(t)$ is the unit step function. The unit step function is well known in the art. The CLK0 signal can be represented mathematically by:

$$CLK0 = F_0(t) = \sum_{n=-\infty}^{n=+\infty} [u(t - nT) - u(t - (n+1)T)].$$

The CLK1 signal can be shifted by $$T_s = \frac{T}{20}$$

from CLK0 and can therefore be represented mathematically by:

$$CLK1 = F_1(t) = F_0(t - T_s) \Rightarrow CLK1 = \sum_{n=-\infty}^{n=+\infty} [u(t - T_s - nT) - u(t - T_s - (n+1)T)]$$

Figure 3:
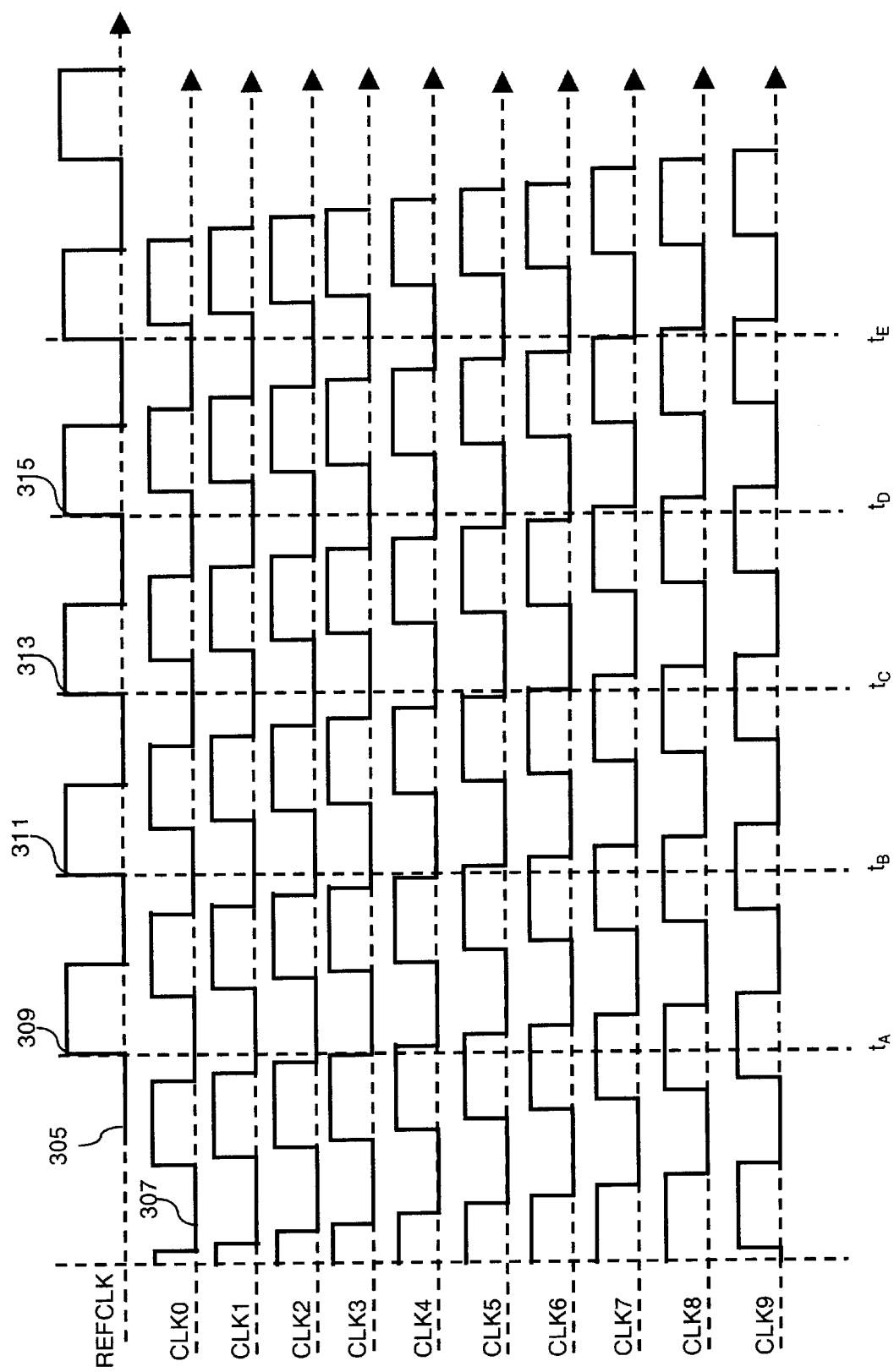
FIG. 3 depicts an exemplary timing diagram of a reference clock signal and a plurality of time shifted input clock signals in accordance with the inventive arrangements.

FIG. 3 depicts an exemplary timing diagram in accordance with the inventive arrangements. Referring to FIG. 3, there is shown a REFCLK signal 305, an input clock CLK0 signal 307 and nine clock signals CLK1, CLK2, CLK3, ..., CLK9. The clock signals CLK1, CLK2, CLK3, ..., CLK9 are shifted versions of the input clock CLK0 signal 307. It should be recognized that the remaining signals, namely CLK10 through CLK19, do not need to be used since the information contained therein are redundant when compared to CLK0 through CLK9 respectively. However, the invention is not limited in this regard. Notably, the complete set of input clock signals CLK0 through CLK19 are shifted such that the total shift is equal to one period of CLK0. Consequently, the partial set of clock signals CLK0 through CLK9 have a total shift of one-half of the period of CLK0.

For *CLK0*, at time instant $t_A$, $$CLK0 = F_0(t_A) = 0 \Rightarrow F_0(t_A) = 0 = \sum_{n=-\infty}^{n=+\infty} [u(t_A - nT) - u(t_A - (n+1)T)].$$

For *CLK1*, at time $t_A$, $$CLK1 = F_1(t_A) = 0 = F_0(t_A - T_s) \Rightarrow$$

$$F_1(t_A) = 0 = \sum_{n=-\infty}^{n=+\infty} [u(t_A - T_s - nT) - u(t_A - T_s - (n+1)T)].$$

For *CLK2*, at time $t_A$, $$CLK2 = F_2(t_A) = 0 = F_0(t_A - 2T_s) \Rightarrow$$

$$F_2(t_A) = 0 = \sum_{n=-\infty}^{n=+\infty} [u(t_A - 2T_s - nT) - u(t_A - 2T_s - (n+1)T)].$$

For *CLK3*, at time time $t_A$, $$CLK3 = F_3(t_A) = 0 = F_0(t_A - 3T_s) \Rightarrow$$

$$F_3(t_A) = 0 = \sum_{n=-\infty}^{n=+\infty} [u(t_A - 3T_s - nT) - u(t_A - 3T_s - (n+1)T)].$$

For *CLK4*, at time time $t_A$, $$CLK4 = F_4(t_A) = 1 = F_0(t_A - 4T_s) \Rightarrow$$

$$F_4(t_A) = 1 = \sum_{n=-\infty}^{n=+\infty} [u(t_A - 4T_s - nT) - u(t_A - 4T_s - (n+1)T)].$$

For *CLK5*, at time time $t_A$, $$CLK5 = F_5(t_A) = 1 = F_0(t_A - 5T_s) \Rightarrow$$

$$F_5(t_A) = 1 = \sum_{n=-\infty}^{n=+\infty} [u(t_A - 5T_s - nT) - u(t_A - 5T_s - (n+1)T)].$$

For *CLK6*, at time time $t_A$, $$CLK6 = F_6(t_A) = 1 = F_0(t_A - 6T_s) \Rightarrow$$

$$F_6(t_A) = 1 = \sum_{n=-\infty}^{n=+\infty} [u(t_A - 6T_s - nT) - u(t_A - 6T_s - (n+1)T)].$$

For *CLK7*, at time $t_A$, $$CLK7 = F_7(t_A) = 1 = F_0(t_A - 7T_s) \Rightarrow$$

$$F_7(t_A) = 1 = \sum_{n=-\infty}^{n=+\infty} [u(t_A - 7T_s - nT) - u(t_A - 7T_s - (n+1)T)].$$

For *ClK8*, at time $t_A$, $$CLK8 = F_8(t_A) = 1 = F_0(t_A - 8T_s) \Rightarrow$$

$$F_8(t_A) = 1 = \sum_{n=-\infty}^{n=+\infty} [u(t_A - 8T_s - nT) - u(t_A - 8T_s - (n+1)T)].$$

For *ClK9*, at time $t_A$, $$CLK9 = F_9(t_A) = 1 = F_0(t_A - 9T_s) \Rightarrow$$

$$F_9(t_A) = 1 = \sum_{n=-\infty}^{n=+\infty} [u(t_A - 9T_s - nT) - u(t_A - 9T_s - (n+1)T)].$$

At a later time $t_B$, wherein $t_B>t_A$, the CLK0 through CLK9 can be sampled. The resulting sampled information can be represented as follows.

For *CLK0*, at time instant $t_B$, $$CLK0 = F_0(t_B) = 0 \Rightarrow F_0(t_B) = 0 = \sum_{n=-\infty}^{n=+\infty} [u(t_B - nT) - u(t_B - (n+1)T)].$$

For *CLK1*, at time instant $t_B$, $$CLK1 = F_1(t_B) = 0 = F_0(t_B - T_s) \Rightarrow$$

$$F_1(t_B) = 0 = \sum_{n=-\infty}^{n=+\infty} [u(t_B - T_s - nT) - u(t_B - T_s - (n+1)T)].$$

For *CLK2*, at time instant $t_B$, $$CLK2 = F_2(t_B) = 0 = F_0(t_B - 2T_s) \Rightarrow$$

$$F_2(t_B) = 0 = \sum_{n=-\infty}^{n=+\infty} [u(t_B - 2T_s - nT) - u(t_B - 2T_s - (n+1)T)].$$

9

-continued

For *CLK3*, at time instant $t_B$, $$CLK3 = F_3(t_B) = 0 = F_0(t_B - 3T_s) \Rightarrow$$

$$F_3(t_B) = 0 = \sum_{n=-\infty}^{n=+\infty} [u(t_B - 3T_s - nT) - u(t_B - 3T_s - (n+1)T)].$$

For *CLK4*, at time instant $t_B$, $$CLK4 = F_4(t_B) = 0 = F_0(t_B - 4T_s) \Rightarrow$$

$$F_4(t_B) = 0 = \sum_{n=-\infty}^{n=+\infty} [u(t_B - 4T_s - nT) - u(t_B - 4T_s - (n+1)T)].$$

For *CLK5*, at time instant $t_B$, $$CLK5 = F_5(t_B) = 1 = F_0(t_B - 5T_s) \Rightarrow$$

$$F_5(t_B) = 1 = \sum_{n=-\infty}^{n=+\infty} [u(t_B - 5T_s - nT) - u(t_B - 5T_s - (n+1)T)].$$

For *CLK6*, at time instant $t_B$, $$CLK6 = F_6(t_B) = 1 = F_0(t_B - 6T_s) \Rightarrow$$

$$F_6(t_B) = 1 = \sum_{n=-\infty}^{n=+\infty} [u(t_B - 6T_s - nT) - u(t_B - 6T_s - (n+1)T)].$$

For *CLK7*, at time instant $t_B$, $$CLK7 = F_7(t_B) = 1 = F_0(t_B - 7T_s) \Rightarrow$$

$$F_7(t_B) = 1 = \sum_{n=-\infty}^{n=+\infty} [u(t_B - 7T_s - nT) - u(t_B - 7T_s - (n+1)T)].$$

For *ClK8*, at time instant $t_B$, $$CLK8 = F_8(t_B) = 1 = F_0(t_B - 8T_s) \Rightarrow$$

$$F_8(t_B) = 1 = \sum_{n=-\infty}^{n=+\infty} [u(t_B - 8T_s - nT) - u(t_B - 8T_s - (n+1)T)].$$

For *ClK9*, at time instant $t_B$, $$CLK9 = F_9(t_B) = 1 = F_0(t_B - 9T_s) \Rightarrow$$

$$F_9(t_B) = 1 = \sum_{n=-\infty}^{n=+\infty} [u(t_B - 9T_s - nT) - u(t_B - 9T_s - (n+1)T)].$$

Notably, in comparing the sampled values for time instants $t_A$ and $t_B$, at $t_A$, CLK4=$F_4(t_A)$=1, while at $t_B$, CLK4=$F_4(t_B)$= 0. However, since $t_B = t_A + T_R$, then $F_0(t_B) = F_0(t_A + T_R)$.

$$\Rightarrow F_0(t_B) = \sum_{n=-\infty}^{n=+\infty} [u(t_A + T_R - nT) - u(t_A + T_R - (n+1)T)].$$

Similarly, $F_1(t_B) = F_0(t_A + T_R - T_s)$, $$\Rightarrow F_1(t_B) = \sum_{n=-\infty}^{n=+\infty} [u(t_A + T_R - T_s - nT) - u(t_A + T_R - T_s - (n+1)T)].$$

Similar expressions can be generated for $F_2(t_B)$, $F_3(t_B)$, $F_4(t_B)$, $F_5(t_B)$, $F_6(t_B)$, $F_7(t_B)$, $F_8(t_B)$, and $F_9(t_B)$.

If the difference between $T_R$ and $T$ is $\Delta t$, then $T_R = T + \Delta t$. Hence, $$F_0(t_B) = \sum_{n=-\infty}^{n=+\infty} [u(t_A + T + \Delta t - nT) - u(t_A + T + \Delta t - (n+1)T)] \Rightarrow F_0(t_B) =$$

10

-continued $$\sum_{n=-\infty}^{n=+\infty} [u(t_A + \Delta t - (n-1)T) - u(t_A + \Delta t - nT)].$$

Similarly, $$F_1(t_B) = \sum_{n=-\infty}^{n=+\infty} [u(t_A + \Delta t - T_s - (n-1)T) - u(t_A + \Delta t - T_s - nT)].$$

Similar expressions can be generated for $F_2(t_B)$, $F_3(t_B)$, $F_4(t_B)$, $F_5(t_B)$, $F_6(t_B)$, $F_7(t_B)$, $F_8(t_B)$, and $F_9(t_B)$.

Notwithstanding, $F_0(t)$, $F_1(t)$, $F_2(t)$, $F_3(t)$, $F_4(t)$, $F_5(t)$, $F_6(t)$, $F_7(t)$, $F_8(t)$, and $F_9(t)$ are all periodic. Consequently, $F_0(t) = F_0(t+T) = F_0(t-T)$ can generally represent the shifted versions of $F_0(t)$. Accordingly, since, $$F_0(t_B) = \sum_{n=-\infty}^{n=+\infty} [u(t_A + \Delta t - (n-1)T) - u(t_A + \Delta t - nT)] \Rightarrow F_0(t_B) =$$

$$\sum_{n=-\infty}^{n=+\infty} [u(t_A + \Delta t - nT) - u(t_A + \Delta t - (n+1)T)] \Rightarrow F_0(t_B) = F_0(t_A + \Delta t)$$

Similarly, $F_1(t_B)=F_1(t_A+\Delta t)$, $F_2(t_B)=F_2(t_A+\Delta t)$ $F_3(t_B)=F_3(t_A+\Delta t)$, $F_4(t_B)=F_4(t_A+\Delta t)$, $F_5(t_B)=F_5(t_A+\Delta t)$, $F_6(t_B)=F_6(t_A+\Delta t)$, $F_7(t_B)=F_7(t_A+\Delta t)$, $F_8(t_B)=F_8(t_A+\Delta t)$, and $F_9(t_B)=F_9(t_A+\Delta t)$. If $\Delta t=0$, then at every sampling time $t_A$, $t_B$, $t_C$, $t_D$, and $t_E$, the logical values of the clocks will be the same. The logical value can be represented by logic "0" or logic "1".

Figure 4:
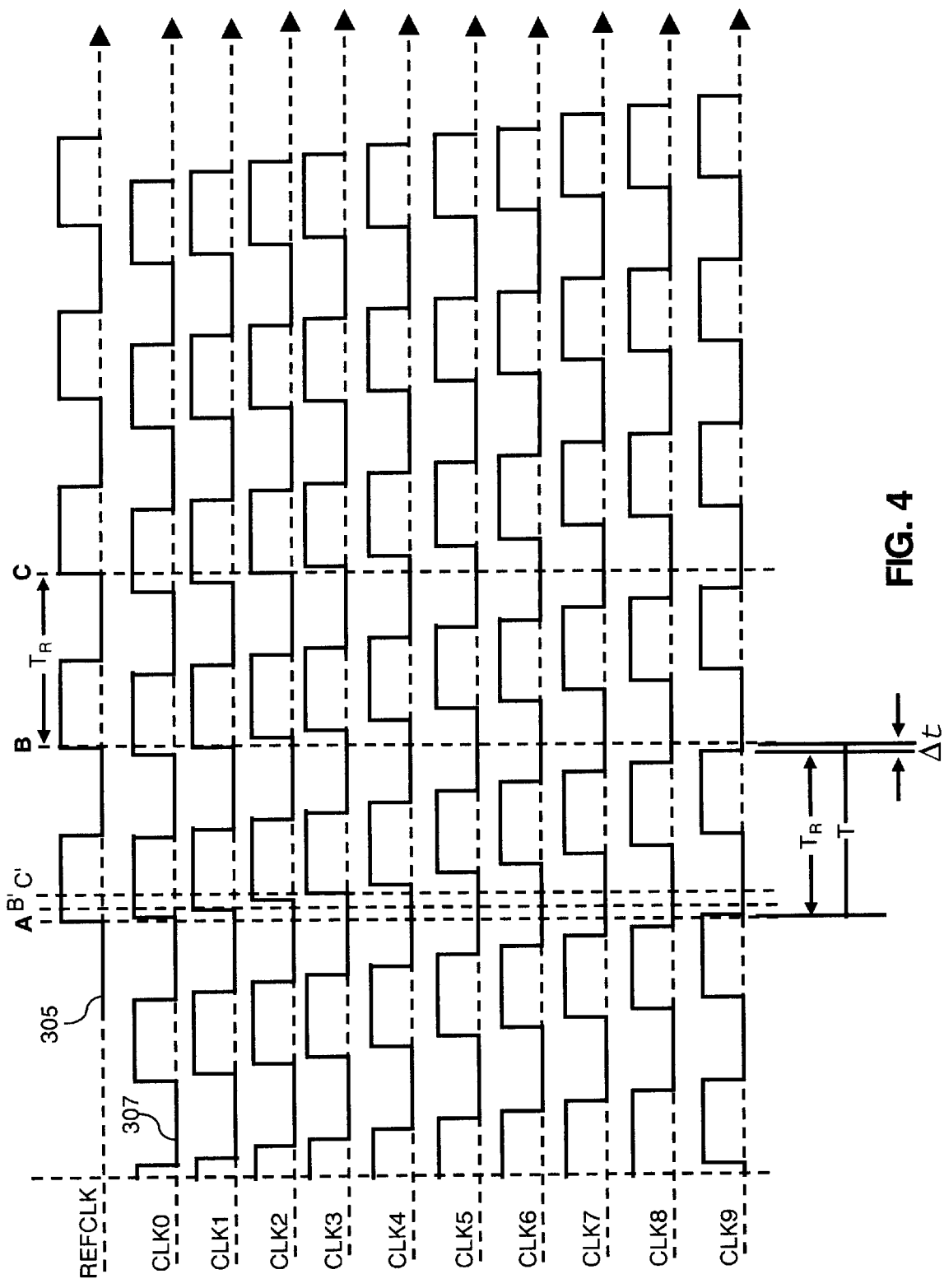
FIG. 4 depicts an exemplary timing diagram of a reference clock signal and a plurality of time shifted input clock signals in accordance with the inventive arrangements.

FIG. 4 depicts a timing diagram in accordance with the inventive arrangements. Referring to FIG. 4, sampling instants A, B and C are shown. Importantly, the values of the respective input clock signals at sampling instant B are the same as the respective input clock signals at sampling instant B'. For example, CLK1=0 at sampling instants B and B' and CLK8=1 at sampling instants B and B'. Moreover, the values of the respective input clock signals at sampling instant C are the same as the respective input clock signals at sampling instant C'. For example, CLK2=0 at sampling instants C and C' and CLK7=1 at sampling instants C and C'. Importantly, when $\Delta t=0$, $T=T_R$ and the input clock signals will have the same values. Whenever $|\Delta t|=T_S$, then in any consecutive two sampling time instants A followed by B or B followed by C, only one of the clocks will change its values. Such a change can include a transition from a logic "0" to a logic "1" or from a logic "1" to a logic "0." Whenever $|\Delta t|=2T_S$, then in any consecutive two sampling time instants A followed by B or B followed by C, two (2) of the clocks will change their values. Similarly, whenever $|\Delta t|=3T_S$, then in any consecutive two sampling time instants A followed by B or B followed by C, three (3) of the clocks will change their values.

In general, if $|\Delta t|=aT_S$, where "a" is a constant, then in any consecutive two sampling time instants, "a" clocks will change their values. However, in a case where "a" is fractional, for example, a=0.8, then 0.8 clocks will change their values. In such a case, in order to provide information pertaining to the number of changes in the input clock signals that will occur over a specified time interval, it can be advantageous to convert "a" to an integer value by using a multiplication factor. For example, in the case where "a" is 0.8, a multiplication factor of 10 converts "a" to 8. Hence, 8 clock signals will change their values over 10 consecutive sampling time instants.

When $\Delta t$ is a fraction of $T_S$, "a" will generally be less than 1 and it can be preferable to consider a plurality of consecutive sampling time instants. Hence, if 10 clocks change over 10 consecutive sampling instants and each clock change occur at a different sampling instant, then $|\Delta t|=T_S$. Similarly, for five changes occurring in 10 consecutive sampling instants, $|\Delta t|=0.5T_S$, and for 15 changes occurring in 10 consecutive sampling instants, $|\Delta t|=1.5T_S$.

Figure 5:
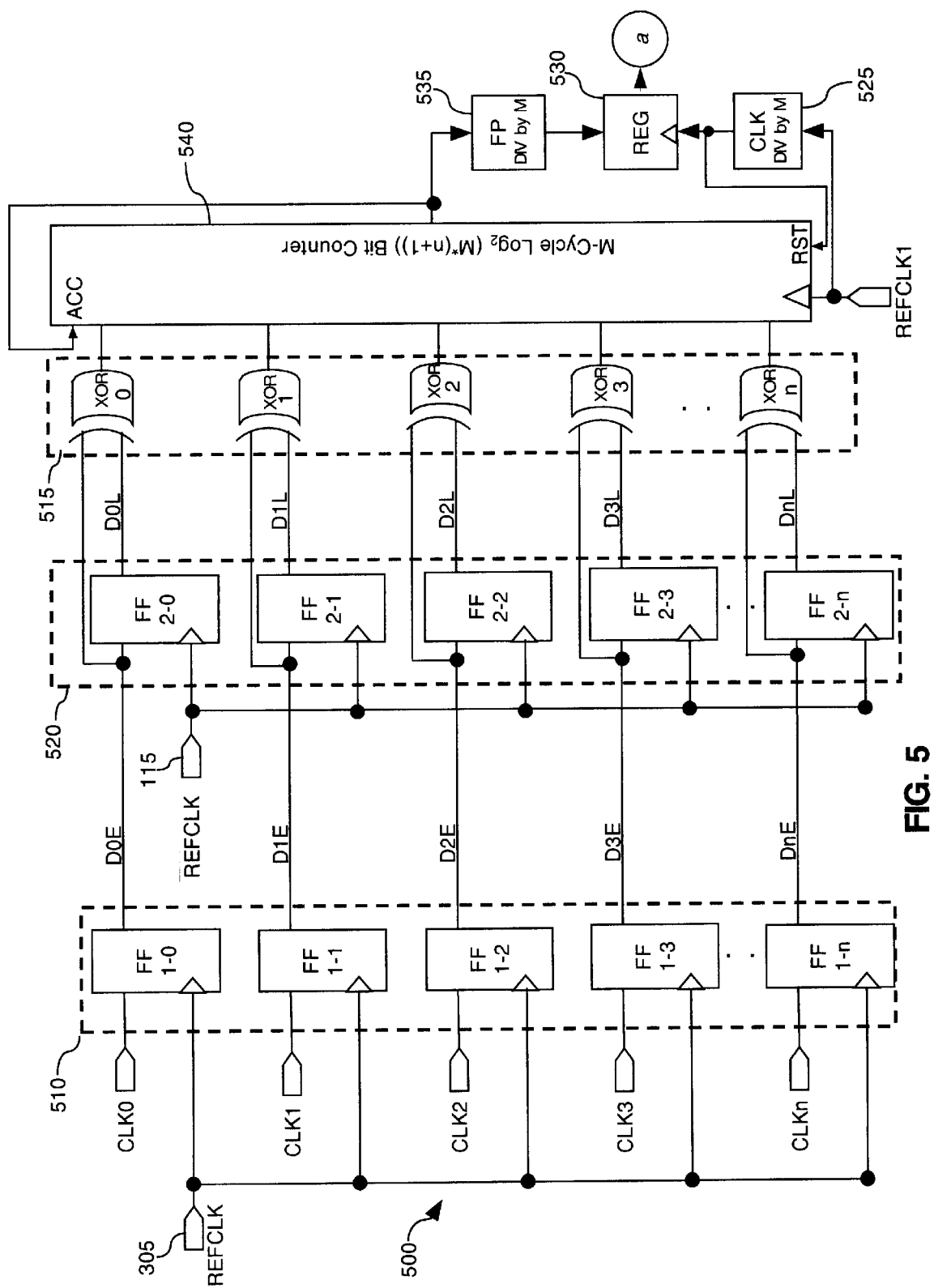
FIG. 5 illustrates an exemplary circuit for determining a change in an input clock signal in accordance with the inventive arrangements.

FIG. 5 illustrates an exemplary circuit 500 in accordance with the inventive arrangements for determining a change in an input clock signal between two consecutive sampling times. Referring now to FIG. 5, a change in the value of an input clock signal from one sampling time instant to the adjacent sampling time can be achieved by executing an exclusive OR (XOR) operation on the output of the flip-flop from the first bank of flip-flops 510, with the output of the flip-flops from the second bank of flip-flops 520 for each input clock signal. In operation, the XOR gate can generate a logic "1" whenever there is a change in the value of an input clock signal from one sampling time instant to an adjacent sampling time. For example, for input clock signal CLK1, the output of flip-flop 1-1 (D1E) and output of flip-flop 2-1 (D1L) can be coupled to an XOR gate XOR1 in the bank of XOR gates 515. Consequently, in a case where 10 consecutive sampling intervals are utilized, the value of $|\Delta t|$ can be determined by counting the number of logic "1's" appearing at the outputs of the XOR gates, namely XOR0, XOR1, XOR2, XOR3, XOR4, XOR5, XOR6, XOR7, XOR8, and XOR9, for ten (10) consecutive sampling intervals.

In this regard $|\Delta t|$ can be determined in terms of $T_S$. Hence, in a case where 10 consecutive sampling intervals are being used, "a" can be determined by dividing the total number of logic "1's" in 10 consecutive sample time instant by 10. The total number of logic "1's" can be determined by using an adder 540, coupled to the outputs of the XOR gates. Adder can be a seven bit (7-bit) parallel adder although the invention is not limited in this regard. Adder 540 can be used to determine both the number of 1's at each sampling time instant and the number of ones occurring over a specified number of consecutive sampling time instants. Notably, it should be recognized that the use of 10 consecutive sampling time instants is for illustrative purposes and the invention is not limited in this regard.

Importantly, it can be necessary to determine $T_S$ since $T_S$ is required to determine $\Delta t$. However, $T_R=T+\Delta t=T+aT_S$. Since there are 20 periodic shifts within one period of the CLK0, then $$T_s = \frac{T}{20}.$$

$T_R$ can be expressed as, $$T_R = T + a\frac{T}{20}.$$
$$\Rightarrow T = T_R\left(\frac{20}{20+a}\right).$$

In this regard, if 8 logic "1's" are found over a 10 consecutive sampling time instants, then a=±0.8, and T can be subsequently determined.

Referring again to FIG. 5, in operation, on the rising edge of REFCLK 305, for example 309 (FIG. 3), the input clocks CLK0 through CLK9 can be sampled and their sampled value can be stored in respective flip-flops FF 1-0 through FF 1-9 in the first bank of flip-flops 310. On the next falling edge of REFCLK 305, namely 311, the information sampled and stored in the first bank of flip-flops 310 can be shifted into the corresponding flip-flops in the second bank of flip-flops 320. At the next rising edge of REFCLK 305, namely 311, the input clocks can be sampled and the sampled values stored in the first bank of flip-flops 310. The contents of the corresponding flip-flops in the banks of flip-flops 310 and 320 can be coupled to the XOR gate inputs XOR0, . . . , XORn. Importantly, the XOR gate can compare the contents of the flip-flop in the first bank with the contents of the flip-flop in the second bank of flip-flops. The XOR gate can generate a logic "1" whenever the contents stored in the flip-flops differ.

Whenever the difference between the frequency of REFCLK 305 and the frequency of the input clock is significant, a portion of the XOR gates can generate a logic "1" at the rising edge of REFCLK 305, for example 309 (FIG. 3). Notably, the occurrences of logic "1" will be consecutive. If $3T_S>(T_R-T)>3T_S$, then 3 consecutive XORs will generate a logic "1." Particularly, the logic "1's" which are generated can be expressed as (i modulo 10), ((i+1) modulo 10) and ((i+2) modulo 10), where $0 \leq i \geq 9$.

For illustrative purposes, the total number of logic "1's" at the rising edge of REFCLK 305, for example 309, (FIG. 3) can be denoted as "b." Therefore, "a" is the average of "b" over 10 clock cycles of REFCLK 305. In order to ensure proper operation of the circuit 500, the values of both "a" and "b" can be limited to 10. In this regard, if $|T_R-T|>10T_S$ the range of frequency for proper operation of circuit 500 can be denoted by, $$T = T_R\left(\frac{20}{20 \pm 10}\right).$$

Hence, $\frac{2}{3}T_R \leq T \leq 2T_R$, and $0.5f_{REFCLK} \leq f_{VCO} \leq 1.5f_{REFCLK}$ where $f_{VCO}$ represents the frequency of the variable frequency oscillator (VCO) or other frequency source creating the input clock signals.

Figure 6A:
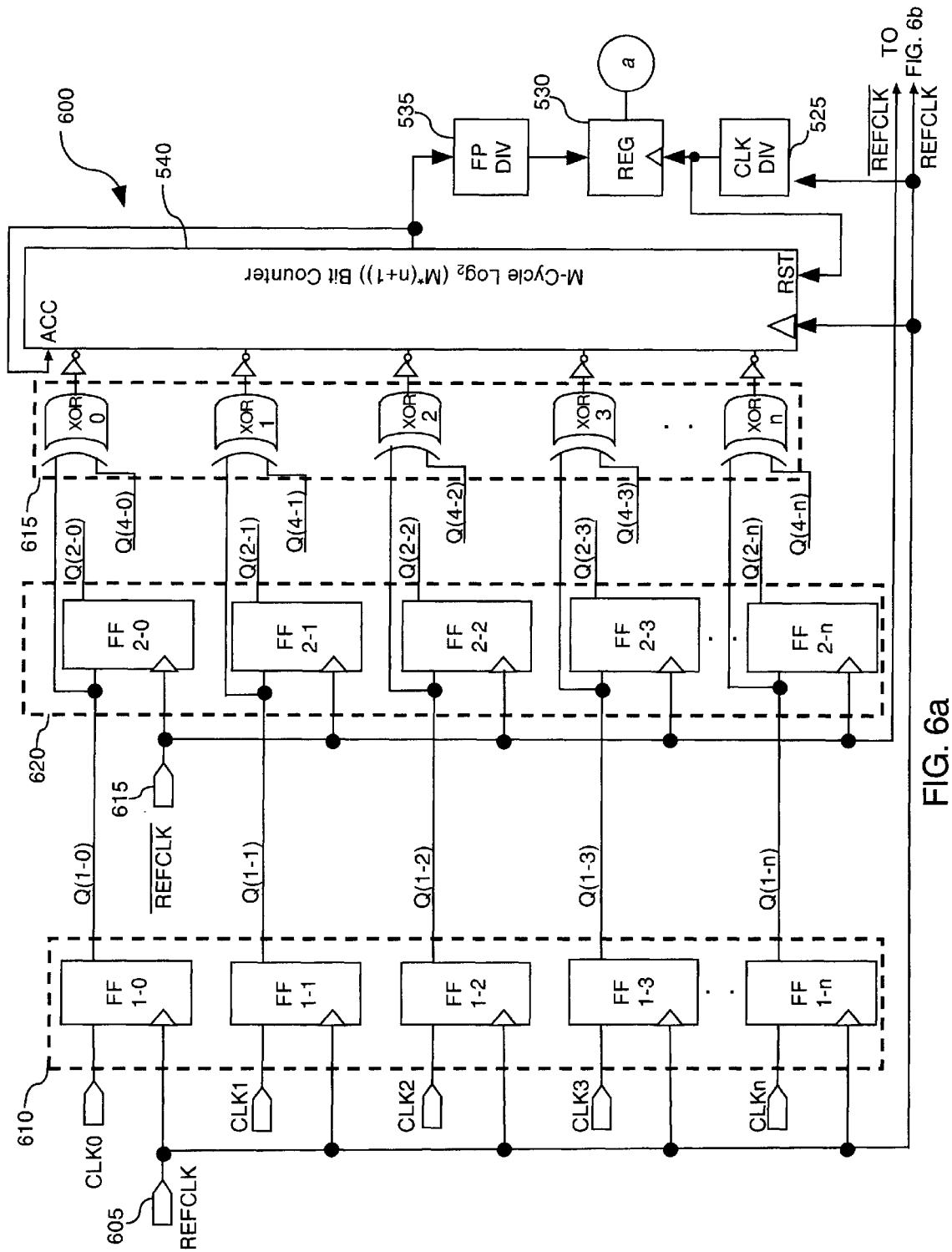
FIGS. 6a and 6b illustrates an enhanced circuit for overcoming range limitations of circuits in accordance with the inventive arrangements.
Figure 6B:
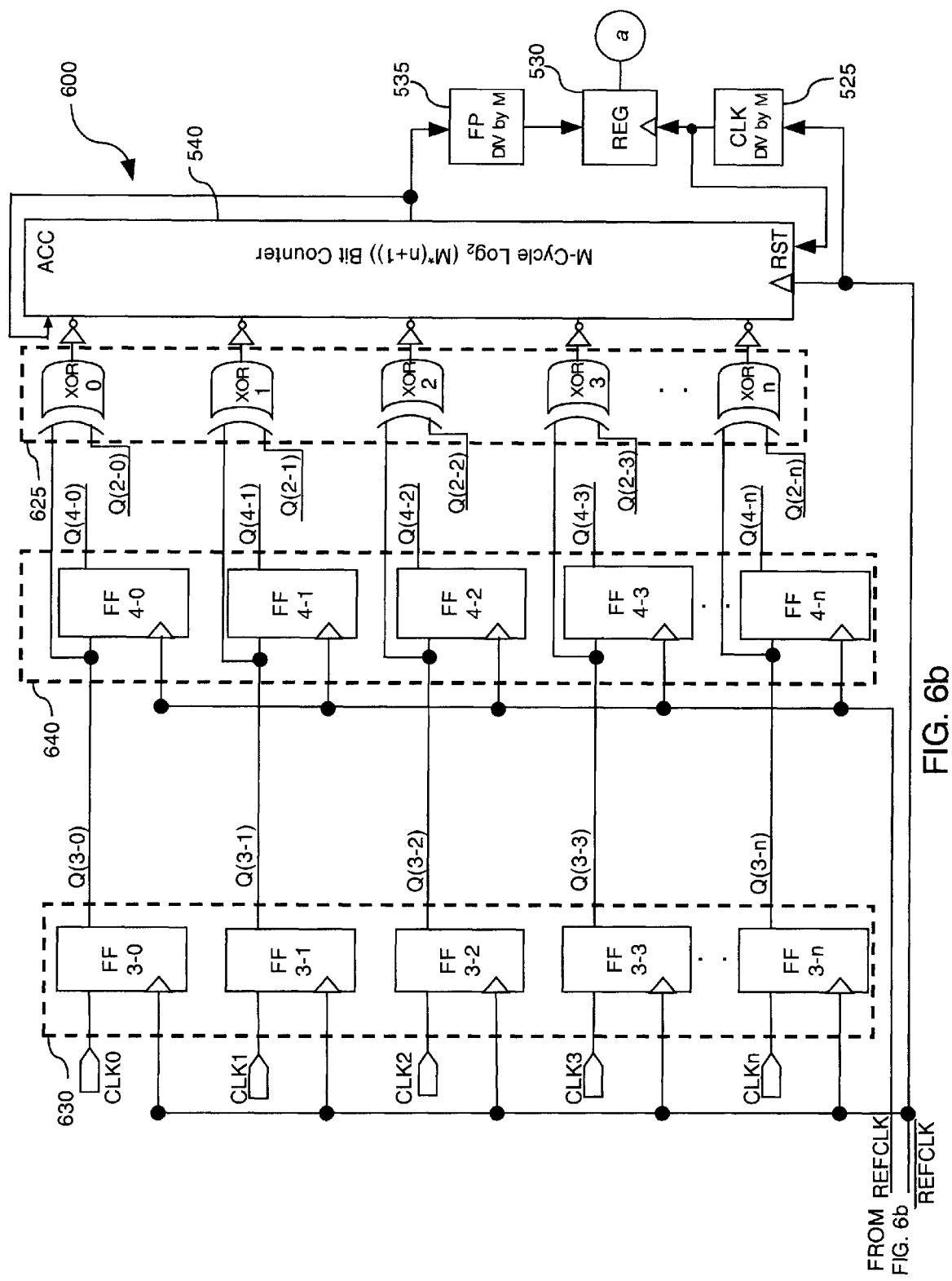

In accordance with the inventive arrangements, the circuit 500 can be enhanced in order to extend its resolution or range of accuracy. FIGS. 6a and 6b illustrates an enhanced circuit 600 that can overcome range limitations of circuit 500. FIG. 6b is a continuation of FIG. 6a. Referring to FIGS. 6a and 6b, circuit 600 comprises a first bank of flip-flops 610, a second bank of flip-flops 620, a third bank of flip-flops 630, a fourth bank of flip-flops 640, a first bank of XOR gates 615 and a second bank of XOR gates 625. Flip-flop banks 610 and 620 and the first bank of XOR gates 615 can be coupled similar to circuit 500 of FIG. 5. Similarly, flip-flop banks 630 and 640 and the second bank of XOR gates 625 can be coupled similar to circuit 500 of FIG. 5.

For illustrative purposes, the operation of circuit 600 can be described with reference to the timing diagram of FIG. 3. Referring to FIG. 3, time instant $t_A$ can be denoted by 309, time instant $t_B$ can be denoted as 311, time instant $t_C$ can be denoted as 313 and time instant $t_D$ can be denoted as 315. In operation, the first bank of flip-flops 610 can sample the input clocks or VCO on the rising edge of REFCLK signal 305, for example 309, while the third bank of the flip-flops 630 can sample the input clocks on the falling edge of the REFCLK signal 305, for example 310. On the falling edge of REFCLK signal 305, for example 310, the second bank of flip-flops 620 can store the value sampled by the first bank of flip-flops 610. On the next rising edge of REFCLK signal 305, for example 311, the fourth bank of flip-flops 640 can store the value previously sampled by the third bank of flip-flops 630 on the previous falling edge of REFCLK signal 305, namely 310. The arrangement of FIG. 6a and 6b can provide a resolution that is twice that provided by circuit 500. Notably, circuit 600 permits every one-half cycle of the REFCLK signal 305 to be measured as opposed to every one cycle of REFCLK signal 305 by circuit 500. Note that a first input of each of XOR gates in the first bank of XOR gates 615 can be singularly coupled to an output of one of the flip-flops of the first bank of flip-flops 610, while a second input of each of the XOR gates can be singularly coupled to an output of one of the flip-flops in the fourth bank of flip-flops 640. Similarly note that a first input of each of the XOR gates in a second bank of XOR gates 625 can be singularly coupled to an output of one of the flip-flops of the second bank of flip-flops 620, while a second input of each of the XOR gates can be singularly coupled to an output of one of the flip-flops of the third bank of flip-flops 630.

Referring once again to FIGS. 6a and 6b, the first bank of XOR gates 615 can be configured to compare sampled values stored in corresponding flips-flops of the first bank of flip-flops 610 and the fourth bank of flip-flops 640. The second bank of XOR gates 625 can be configured to compare sampled values stored in corresponding flips-flops of the second bank of flip-flop 620 and the third bank of flip-flops 630. In this arrangement, the second bank of XOR gates 625 can compare values sampled by the third bank of flip-flops 630 at $t_1$ with values that have been stored by the second bank of flip-flops 620 at $t_1$. Similarly, the first bank of XOR gates 615 can compare values sampled by the first bank of flip-flops 610 at $t_2$ with values that have been stored by the fourth bank of flip-flops 640 at $t_2$. Notably, the value compared by the first bank of XOR gates at $t_2$ is the value sampled by the first bank of flip-flops 610 at $t_2$ and the values sampled by the third bank of flip-flops at time instant $t_1$. Accordingly, the second bank of XOR gates 625 effectively compares values that have been sampled by the third bank of flip-flops 630 at time instant $t_1$ with values that have been sampled by the first bank of flip-flops 610 at time instant $t_0$. The arrangement of circuit 600 can permit up to 20 consecutive logic "1" to be generated at the outputs of the first bank of XOR gates 615 and the second bank of the XOR gates 625.

In a case where $T_0=T_R$, it should be expected that the value resulting from the comparison at time instant $t_0$ would be the inverse polarity of what has been sampled by the third bank of flip-flops 630 at time instant $t_1$. Notably, it can be preferable to use an XNOR or negative XOR gate to generate a logic "1" whenever the values generated by the third bank of flip-flops 630 and the second bank of flip-flops 620 are the same. Similarly, it can also be preferable to use an XNOR or negative XOR gate to generate a logic "1" whenever the values generated by the fourth bank of flip-flops 640 and the first bank of flip-flops 610 are the same.

Figure 7A:
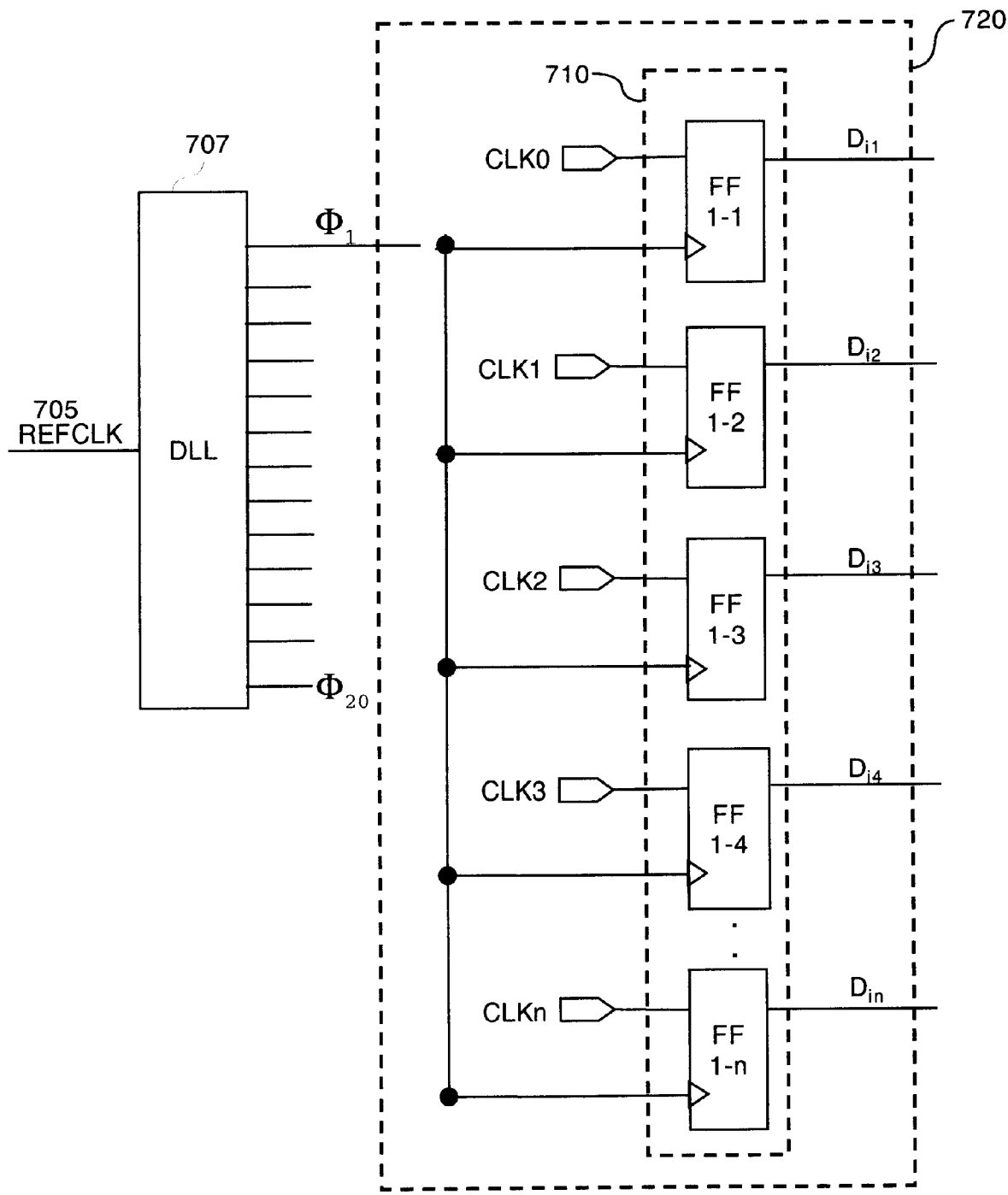
FIGS. 7a and 7b illustrate various aspects of an exemplary circuit for enhancing the resolution of a frequency detection circuit in accordance with the inventive arrangements.

In accordance with the inventive arrangements, a delay locked loop (DLL) can be used to further enhance the resolution of the frequency detection circuits 500 and 600. Referring to FIG. 7a, there is shown a single frequency detector 720 and a DLL 707. The frequency detector 720 can include a bank of flip-flops 710 configured in a manner similar to the first bank of flip-flop 110 of FIG. 1. Notably, instead of the REFCLK signal 105 being coupled directly to the clock input of each flip-flop in the first bank of flip-flops 110 as shown in FIG. 1, a REFCLK signal 705 can be coupled to an input of DLL 707. Each of the different phased outputs of the DLL 707 have the same frequency as REFCLK 705 and can be respectively coupled to a clock input of a flip-flop in the bank of flip-flops 710. For example, output $\Phi_1$ of DLL 707 can be coupled to a clock input of FF 1-1 in the bank of flip-flops 710. The flip-flops can be D-type flip-flops although the invention is not limited in this regard.

Figure 7B:
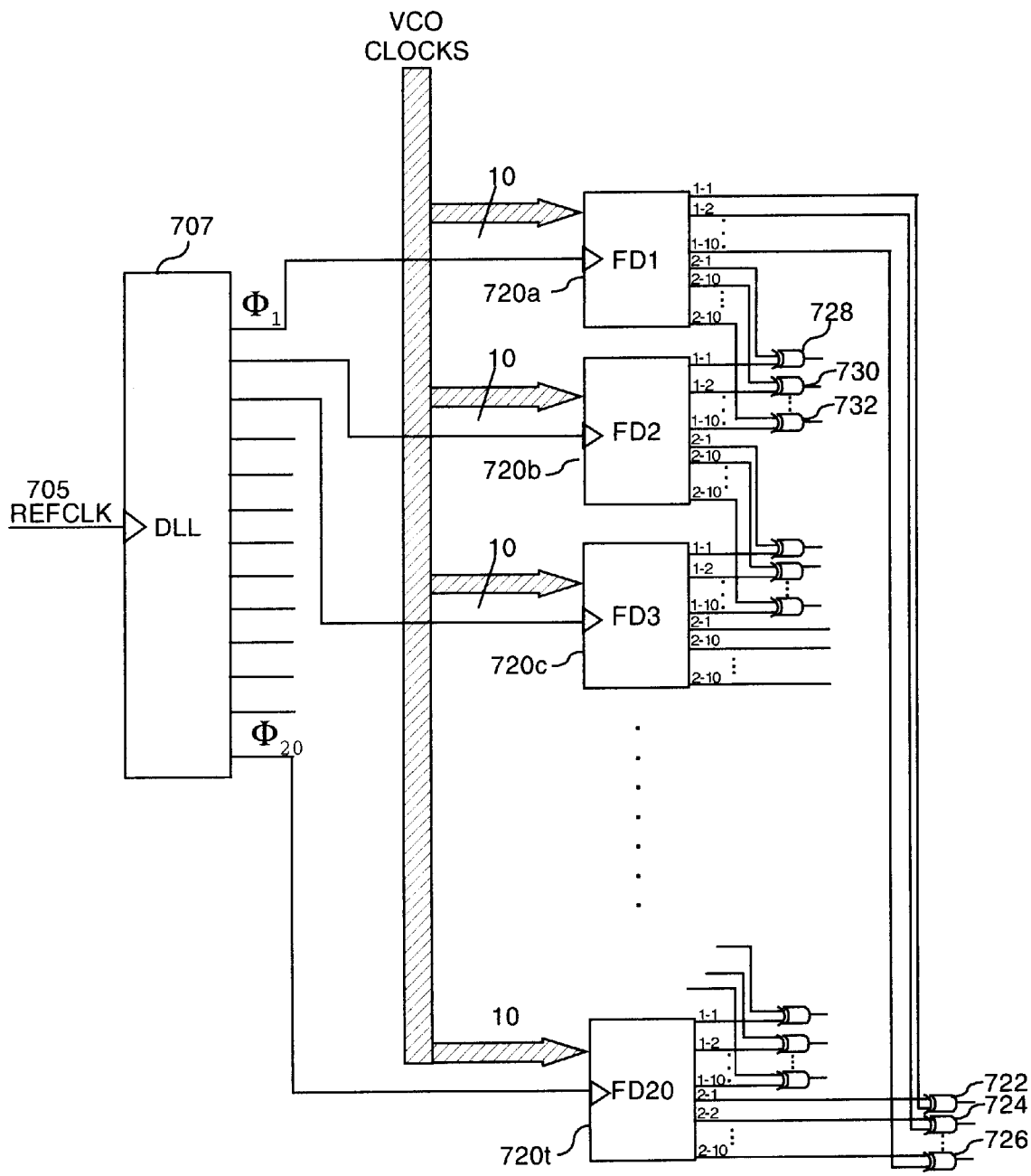

Referring to FIG. 7b, there is shown a plurality of frequency detectors 720a, 720b, 720c, . . . , 720t. These frequency detectors can be the same as those shown in FIG. 1. Each of the clock inputs of the frequency detectors 720a, . . . , 720t can be coupled to an output of DLL 707. For example, output $\Phi_1$ of DLL 707 can be coupled to a clock input of frequency detector 720a. Similarly, output $\Phi_{20}$ of DLL 707 can be coupled to a clock input of frequency detector 720t. The input or VCO clock signals can each be coupled to the input of each of the frequency detectors 720a, . . . , 720t. Each frequency detector FD1, FD2, . . . , FD20 contains 20 outputs, namely 1-1, 1-2, . . . , 1-10, 2-1, 2-2, . . . , 2-10. In this regard, the outputs 2-1, 2-2, . . . , 2-10 are the complement of outputs 1-1, 1-2, . . . , 1-10 respectively. Respective outputs of each of the frequency detectors can be coupled to the inputs of XOR gates as shown. For example, the first (1st) output 1-1 of frequency detector 720a and the eleventh (11th) output of frequency detector 720t, namely 2-1, can be respectively coupled to a second (2nd) and a first (1st) input of XOR gate 722. The second (2nd) output 1-2 of frequency detector 720a and the twelfth (12th) output of frequency detector 720t, namely 2-2, can be respectively coupled to a second (2nd) and a first (1st) input of XOR gate 724. The tenth (10th) output 1-10 of frequency detector 720a and the twentieth (20th) output of frequency detector 720t, namely 2-10, can be respectively coupled to a second (2nd) and a first (1st) input of XOR gate 726. The eleventh (1th) output 2-1 of frequency detector 720a and the first (1st) output of frequency detector 720b, namely 1-1, can be respectively coupled to a second (2nd) and a first (1st) input of XOR gate 728. The twelfth (12th) output 2-2 of frequency detector 720a and the second (2nd) output of frequency detector 720b, namely 1-2, can be respectively coupled to a second (2nd) and a first (1st) input of XOR gate 73. The twentieth (20th) output 2-10 of frequency detector 720a and the tenth (10th) output of frequency detector 720b, namely 1-10, can be respectively coupled to a second (2nd) and a first (1st) input of XOR gate 732.

The second (2nd) output of frequency detector 720a and the second (2nd) output of frequency detector 720b can be coupled to the inputs of XOR gate 724. An input of XOR gate 724 can be coupled to an input of XOR gate 730. XOR gate 730 can further couple a second (2nd) output of the frequency detector 720c. In this arrangement, all the second (2nd) outputs of frequency detectors 720a, 720b, 720c, . . . , 720t can be tied through XOR gates. Similar connections are made in order to couple all the respective outputs of the frequency detectors using XOR gates.

The inventive arrangement of FIGS. 7a and 7b can be configured to utilize two sets of clocks. There can be a set of 10 VCO/input clock signals and a set of 20 REFCLK 705 signals generated by the DLL 705. The VCO signals can be time-shifted signals having the same frequency. The frequency of the VCO signals can be dependent on the voltage of the oscillator. The signals from the output of the DLL can differ in phases but their frequency can be the same as the REFCLK 705 frequency.

In operation, on the rising edge of every REFCLK 705, the input clocks can be sampled. The REFCLK 705 signals can be represented as $\Phi_1, \Phi_2, \Phi_3, \ldots, \Phi_{20}$. The rising edge of REFCLK 705 can be represented by $\Phi_1$. At $\Phi_1$, the frequency detector 720a can sample the input clocks. Similarly, at $\Phi_2, \Phi_3, \ldots, \Phi_{20}$, the VCO clock is sampled. The XOR gates coupled to the outputs of the frequency detectors can be configured to detect changes or transitions in the state of any of the VCO clocks occurring between two consecutive REFCLK signals. This change can be represented as:

$$\Phi_{(i \bmod 20)}, \Phi_{((i+1) \bmod 20)} \text{ where } 0 \leq i \leq 10.$$

The outputs of the frequency detectors can be labeled $D_i$. So, $D_{i1}$ and $D_{(i+1)1}$ can be coupled to an XOR gate to determine when a transition occurs. Similarly, $D_{i2}$ and $D_{(i+1)2}$ can be couples to an XOR gate to determine when a transition occurs. The remaining signals can be coupled to XOR gates in a similar manner. Notably, within an interval $(\Phi_{(i+1)} - \Phi_i)$, the number of transitions can be measured by the outputs of the XOR gates.

If the period of REFCLK is represented by $T_R$, and $(\Phi_{(i+1)} - \Phi_i) = T_r$, then, $$T_r = \left(\frac{T_R}{20}\right)$$

since there were 20 REFCLK signals. In a case where there were "x" REFCLK signals, then $$T_r = \left(\frac{T_R}{x}\right).$$

If the period of the VCO signal is $T_v$, and the difference between any two consecutive VCO signals is $T_v$, then, $$T_v = \left(\frac{T_V}{20}\right).$$

During a time period $T_r$, the number of $T_v$'s that have occurred can be measured. The number of $T_v$'s that have occurred during time period $T_r$ can be denoted by "a." Preferably, this measurement can be done over all $T_r$'s in $T_R$. This can provide an average of "a" over the total number of $T_r$'s in $T_R$, which in this case is twenty (20) times. Hence, $$T_r = \left(\frac{a_1 + a_2 + a_3 + \ldots + a_{20}}{20}\right) \cdot T_v,$$

where $a_1 + a_2 + a_3 + \ldots + a_{20}$ represents the number of transitions in the input or VCO clocks that occur in $T_{r1}$, $T_{r2}$, $T_{r3}$, ..., $T_{r20}$ consecutively. However, $a_1 + a_2 + a_3 + \ldots + a_{20}$ can be denoted as "A."

$$\Rightarrow T_r = \left(\frac{A}{20}\right) \cdot T_v = \left(\frac{A}{20}\right) \cdot \left(\frac{T_V}{20}\right), \text{ and}$$

$$\Rightarrow T_V = \left(\frac{400}{A}\right) \cdot T_r = \left(\frac{400}{A}\right) \cdot \left(\frac{T_R}{20}\right) = \left(\frac{20}{A}\right) \cdot T_R.$$

Figure 8:
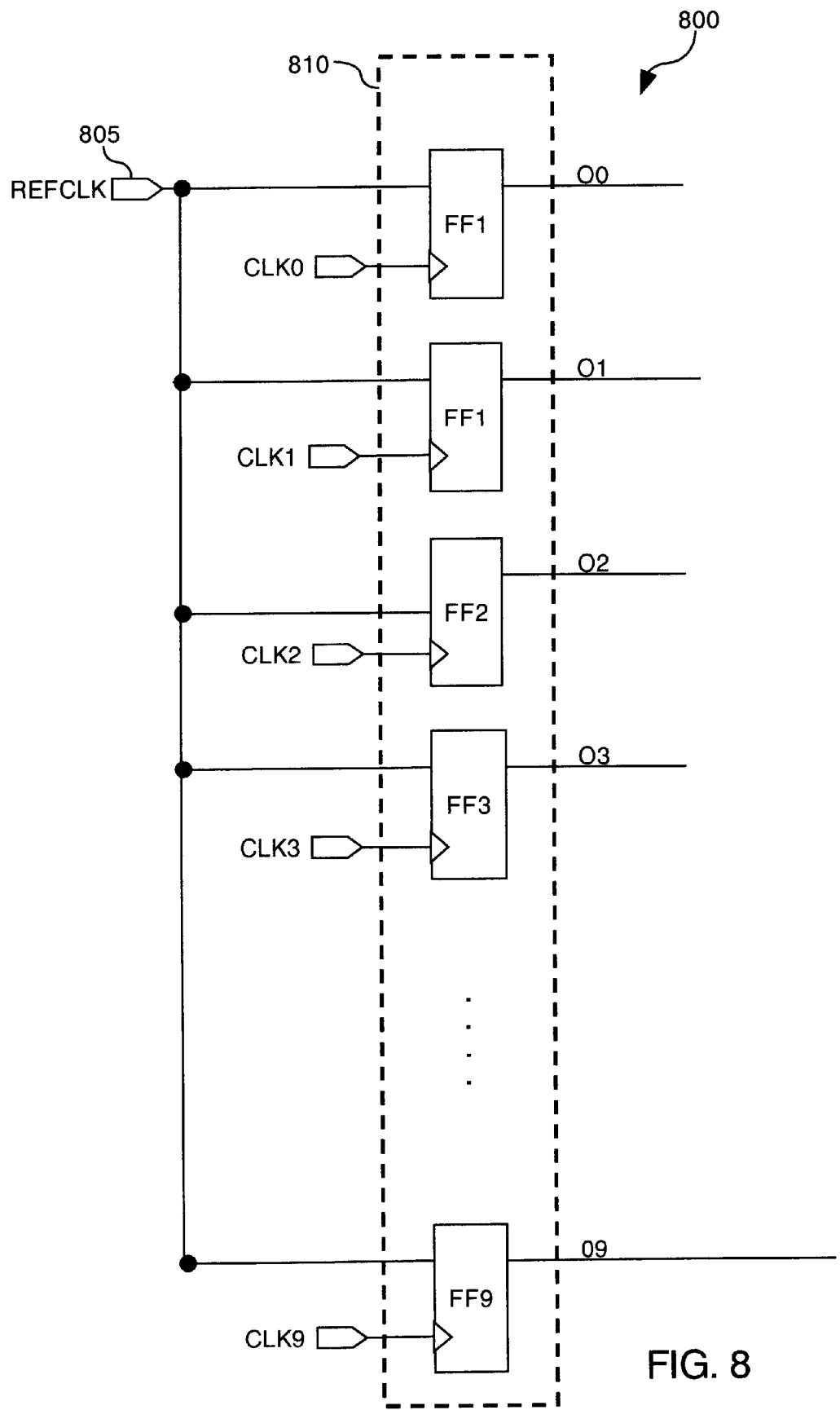
FIG. 8 depicts an exemplary time detector circuit in accordance with the inventive arrangements.

In another embodiment of the invention, a time detector (TD) circuit is provided for measuring the frequency of the input or VCO clocks. The frequency of the input or VCO clocks can be determined by measuring the number of logic "1" that occur over a specified interval. FIG. 8 depicts an exemplary time detector circuit 800 in accordance with the inventive arrangements. Referring to FIG. 8, there is shown a bank of flip-flops 810. The bank of flip-flops 810 can include ten (10) flip-flops, namely FF0, FF1, FF2, FF3, ..., FF9. A REFCLK signal 805 can be connected to an input of the each of the flip-flops in the bank of flip-flops 810. Input or VCO clock signals CLK0, CLK1, CLK2, CLK3, ..., CLK9 can be connected to the clock input of flip-flops, namely FF0, FF1, FF2, FF3, ..., FF9, respectively. The output of the flip-flops FF0, FF1, FF2, FF3, ..., FF9 are O1, O2, O3, ..., O9, respectively. It should readily be recognized that although ten (10) flip-flops are utilized, the invention is not limited in this regard.

In operation, the time detector 800 can be configured to utilize the input or VCO clocks to sample the REFCLK signal 805. For illustrative purposes, CLK0 can be the reference clock signal for all the VCO clocks. At an initial time $t_0$, on the rising edge of CLK0, all the clocks CLK0 through CLK9 can sample REFCLK at different times. The outputs of the flip-flops FF0, FF1, ..., FF9 can represent the sampled values of REFCLK. For example, at a time t1, where $t_1 > t_0$, the outputs of O0 through O9 of FF0 through FF9 can be represented as an output code of 0000111111, respectively. A transition from a logic "0" to a logic "1" can indicate that the rising edge of REFCLK 805 occurs between the VCO clocks that indicate the change. If the VCO clocks have the same frequency as REFCLK 805, then sampling the REFCLK signal at the next clock signal of the VCO clocks will generate the same output at O0–O9 as the previous sample. In that case, if the sample occurred at a time $t_2$, where $t_2 > t_1$, then O0–O9 can also have the same output code of 0000111111.

In a case where the frequency of REFCLK 805 is less than the point where a transition in outputs O0–O9 would occur, the transition point would be shifted towards the left in a direction towards O0. For example, at a time $t_2$, where $t_2 > t_1$, then O0–O9 can have an output code of 0011111000. The difference in time between the clock periods can be determined by comparing the output code at time $t_2$ with output code at time $t_1$. This can be achieved by XOR'ing each bit of the second code with its corresponding bit from the first code. Notably, the XOR operation using XOR gates can determine how many bits have changed states between the two periods. Accordingly, since the period of the VCO signal changes while the period of the REFCLK signal remains fixed, the number of logic "1" (ones) at the output of the XOR gates can signify the number of $T_S$'S. For example, $$T_s = \frac{T}{20}$$

and represent the shift between clocks comprising a clock set over one period of CLK0. In this regard, the clock set contains 20 clock signals although the invention is not limited in this regard.

Since the difference between the period, $T_R$, of REFCLK and the VCO period, T, is equivalent to $aT_S$, the prior equations utilized for determining the frequency range and error for the frequency detector 600 can be appropriately applied to the time detector 800. However, an important difference can include the measurement of the frequency in the VCO. In the case of the frequency detector 600, the error, $$\frac{T_s}{T_R} = \frac{T_{VCO}}{20 \times T_R}.$$

Since the period of the REFCLK signal is fixed, whenever the VCO period decreases, the error decreases. Consequently, the error with respect to REFCLK is variable. With regards to the time detector 800, since a VCO clock signal is utilized as a reference clock, the error can be considered fixed. In this case, $$\frac{T_s}{T_{VCO}} = \frac{T_{VCO}}{20 \times T_{VCO}} = \frac{1}{20}.$$

A second difference pertains to the relationship between the number of logic "1's" and the VCO frequency or VCO period. In the case of the frequency detector, there is a linear relationship between the number of logic "1's" and the VCO frequency. However, there is a non-linear relationship between the number of logic "1's" and the VCO period. In the case of the time detector, there is a linear relationship between the number of logic "1's" and the VCO period. However, there is a non-linear relationship between the number of logic "1's" and the VCO frequency. Importantly, depending on the application and appropriate considerations regarding the relationship between time/frequency and the number of logic "1's," either the time detector or the frequency detector can be utilized.

In light of the foregoing description of the invention, it should be recognized that the present invention can be realized in hardware, software, or a combination of hardware and software. A method and system for determining frequency and time variations between electronic signals according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

The embodiments and architecture described above should give a circuit designer greater flexibility in designing high-speed electronic circuits that require a high resolution to ensure proper synchronization during switching. Notably, the increased resolution can ensure that component and system functionality can be maintained during switching. Advantageously, the frequency and time detection method and circuit described herein can also provide a less costly design and development path than with current systems.

Additionally, the description above is intended by way of example only and is not intended to limit the present invention in any way, except as set forth in the following claims.

What is claimed is:

1. A method for determining variation between a frequency of an input clock signal and a frequency of a reference clock signal, the method comprising:

generating a plurality of time shifted input clock signals, said time shifted signals shifted relative to the input clock signal;

sampling said plurality of time shifted signals at periodic intervals relative to said reference clock signal; and comparing values for said sampled time shifted signals with values for the reference clock signal to determine the variation between the frequency of the input clock signal and a frequency of the reference clock signal, said variation selected from the group consisting of said frequency of said input clock signal being less than said frequency of said reference clock signal, said frequency of said input clock signal being greater than said frequency of said reference clock, and said frequency of said input clock signal being equal to said frequency of said reference clock signal.

2. The method according to claim 1, wherein said generating step further comprises shifting each of said plurality of time shifted signals by an amount equivalent to the period of said input clock signal divided by the number of said plurality of input clock signals.

3. The method according to claim 2, wherein said generating step further comprises maintaining a constant frequency for each of said plurality of time shifted signals.

4. The method according to claim 1, wherein said sampling step further comprises sampling at least one of said plurality of time shifted signals on a first rising edge of said reference clock signal, said sampling step yielding a first sampled value for said at least one of said plurality of time shifted signals.

5. The method according to claim 4, wherein said sampling step further comprises storing a value for said at least one of said plurality of time shifted signals.

6. The method according to claim 5, wherein said storing step further comprises storing said value for said at least one of said plurality of time shifted signals on a first falling edge of said reference clock signal occurring subsequent to said first rising edge of said reference clock signal.

7. The method according to claim 6, wherein said sampling step further comprises sampling said at least one of said plurality of time shifted signals on a second rising edge of said reference clock signal occurring subsequent to said first rising edge of said reference clock signal, said sampling step yielding a second sampled value for said at least one of said plurality of time shifted signals.

8. The method according to claim 7, wherein said comparing step further comprises comparing said first and said second sampled value for said at least one of said plurality of time shifted signals.

9. An electronic circuit for determining variation between a frequency of an input clock signal and a frequency of a reference clock signal, the electronic circuit comprising:

means for generating a plurality of time shifted input clock signals, said time shifted signals shifted relative to the input clock signal;

means for sampling said plurality of time shifted signals at periodic intervals relative to said reference clock signal; and means for comparing values for said sampled time shifted signals with values for the reference clock signal to determine the variation between the frequency of the input clock signal and a frequency of the reference clock signal, said variation selected from group consisting of said frequency of said input clock signal being less than said frequency of said reference clock signal, said frequency of said input clock signal being greater than said frequency of said reference clock signal, and said frequency of said input clock signal being equal to said frequency of said reference clock signal.

10. The electronic circuit according to claim 9, wherein said generating means further comprises means for shifting each of said plurality of time shifted signals by an amount equivalent to the period of said input clock signal divided by the number of said plurality of input clock signal.

11. The electronic circuit according to claim 10, wherein plurality of time shifted signals have the same frequency.

12. The electronic circuit according to claim 9, wherein said sampling means further comprises means for sampling at least one of said plurality of time shifted signals on a first rising edge of said reference clock signal, said sampling means yielding a first sampled value for said at least one of said plurality of time shifted signals.

13. The electronic circuit according to claim 12, wherein said sampling means further comprises means for storing a value for said at least one of said plurality of time shifted signals.

14. The electronic circuit according to claim 13, wherein said storing means further comprises means for storing said value for said at least one of said plurality of time shifted signals on a first falling edge of said reference clock signal occurring subsequent to said first rising edge of said reference clock signal.

15. The electronic circuit according to claim 14, wherein said sampling means further comprises means for sampling said at least one of said plurality of time shifted signals on a second rising edge of said reference clock signal occurring subsequent to said first rising edge of said reference clock signal, said sampling means yielding a second sampled value for said at least one of said plurality of time shifted signals.

16. The electronic circuit according to claim 15, wherein said comparing means further comprises means for comparing said first and said second sampled value for said at least one of said plurality of time shifted signals.

17. A high resolution frequency detection circuit for determining variance between an input clock signal and a reference signal, comprising:
  a first bank of flip-flops, wherein a clock input of each of said flip-flops is coupled to the reference clock signal and each input of said flip-flops is singularly coupled to one of a plurality of time shifted input clock signals;
  a second bank of flip-flops, wherein each input of said flip-flops in said second bank of flip-flops is singularly coupled to an output of each of said flip-flops in said first bank of flip-flops; and
  a first bank of XOR gates, wherein a first input of each of said XOR gate is singularly coupled to an output of one of said flip-flops of said first bank of flip-flops and a second input of each of said XOR gate is singularly coupled to an output of one of said flip-flops of said second bank of flip-flops, each of said XOR gates comparing a previously sampled value for an input clock signal with a successively sampled value for said input clock signal.

18. The high resolution frequency detection circuit according to claim 17, wherein a clock input of each of said flip-flops in said second bank of flip-flops is coupled to a signal that is the complement of said reference clock signal.

19. The high resolution frequency detection circuit according to claim 17, further comprising a $\log_2(n)$ bit adder wherein each input of said n-bit adder is singularly coupled to an output of one of said XOR gates of said first bank of XOR gates.

20. A high resolution frequency detection circuit for determining variance between an input clock signal and a reference signal, comprising:
  a first bank of flip-flops, wherein a clock input of each of said flip-flops is coupled to the reference clock signal and each input of said flip-flops is singularly coupled to one of a plurality of time shifted input clock signals;
  a second bank of flip-flops, wherein each input of said flip-flops in said second bank of flip-flops is singularly coupled to an output of each of said flip-flops in said first bank of flip-flops;
  a third bank of flip-flops, wherein a clock input of each of said flip-flops in said third bank of flip-flops is coupled to a complement of the reference clock signal and each input of said flip-flops is singularly coupled to one of a plurality of time shifted input clock signals;
  a fourth bank of flip-flops, wherein each input of said flip-flops in said fourth bank of flip-flops is singularly coupled to an output of each of said flip-flops in said third bank of flip-flops;
  a first bank of XOR gates, wherein a first input of each of said XOR gate is singularly coupled to an output of one of said flip-flops of said first bank of flip-flops and a second input of each of said XOR gates is singularly coupled to an output of one of said flip-flops of said fourth bank of flip-flops, each of said XOR gates comparing a previously sampled value for an input clock signal with a successively sampled value for said input clock signal; and
  a second bank of XOR gates, wherein a first input of each of said XOR gate in said second bank of XOR gates is singularly coupled to an output of one of said flip-flops of said third bank of flip-flops and a second input of each of said XOR gates is singularly coupled to an output of one of said flip-flops of said second bank of flip-flops, each of said XOR gates comparing a previously sampled value for an input clock signal with a successively sampled value for said input clock signal.

21. The high resolution frequency detection circuit according to claim 20, wherein a clock input of each of said flip-flops in said second bank of flip-flops is coupled to a signal that is the complement of said reference clock signal.

22. The high resolution frequency detection circuit according to claim 20, wherein a clock input of each of said flip-flops in said fourth bank of flip-flops is coupled to the reference clock signal.

23. The high resolution frequency detection circuit according to claim 17, further comprising a first $\log_2(n)$ bit adder wherein each input of said first n-bit adder is singularly coupled to an output of one of said XOR gates of said first bank of XOR gates.

24. The high resolution frequency detection circuit according to claim 17, further comprising a second $\log_2(n)$ bit adder wherein each input of said first n-bit adder is singularly coupled to an output of one of said XOR gates of said second bank of XOR gates.

25. An enhanced resolution frequency detection circuit for determining the variance between an input clock signal and a reference signal, comprising:
  a delay-locked loop having an input reference clock signal coupled thereto;
  a plurality of frequency detection circuits, each clock input of said frequency detection circuit coupled to a separate output of said delay-locked loop, and each input of said frequency detection circuit couples to a set of time shifted input clock signals; and a plurality of XOR gates, each of said plurality of XOR gates coupled to an output of each of said plurality of frequency detection circuits so as to provide an XOR operation of all bits in a same bit position at the output of each of said frequency detection circuit.

26. A time detection circuit for determining the variance between an input clock signal and a reference signal, comprising:

a first bank of n flip-flops, a plurality of time shifted input clock signals, each of said time shifted input clock signals singularly coupled to an input of a flip-flop in said first bank of n flip-flops; and a reference clock signal coupled to an input of each of said n flip-flops of said first bank.

\* \* \* \* \*